United States Patent [19]

Molnar et al.

[11] Patent Number: 5,691,992
[45] Date of Patent: Nov. 25, 1997

[54] PUNCTURED CODING SYSTEM FOR PROVIDING UNEQUAL ERROR PROTECTION IN A DIGITAL COMMUNICATION SYSTEM

[75] Inventors: Barbara Davis Molnar; Stanley Lynn Reinhold; Amer Aref Hassan, all of Cary, N.C.

[73] Assignee: Ericsson Inc., Research Triangle Park, N.C.

[21] Appl. No.: 542,276

[22] Filed: Oct. 12, 1995

[51] Int. Cl.⁶ .................................................. H03M 13/00
[52] U.S. Cl. .......................................................... 371/37.1
[58] Field of Search .............................. 371/43, 37.1, 30

[56] References Cited

U.S. PATENT DOCUMENTS

| | | | |
|---|---|---|---|
| 5,099,482 | 3/1992 | Cameron | 371/37.1 |
| 5,197,061 | 3/1993 | Halbert-Lassale et al. | 370/204 |
| 5,305,352 | 4/1994 | Calderbank et al. | 375/261 |

FOREIGN PATENT DOCUMENTS 0676875  11/1995  European Pat. Off. .

OTHER PUBLICATIONS

Yutaka Yasuda, Kanshiro Kashiki and Yasuo. Hirata, "High–Rate Punctured Convolutional Codes for Soft Decision Viterbi Decoding," *IEEE Transactions on Communications*, vol. Com–32, No. 3, Mar. 1984.

Kjell J. Hole, "An Algorithm for Determining If a Rate (n–1)/n Punctured Convolutional Encoder is Catastrophic," *IEEE Transactions on Communications*, vol. 39, No. 3, Mar. 1991.

*Primary Examiner*—Stephen M. Baker
*Attorney, Agent, or Firm*—David G. Matthews

[57] ABSTRACT

A coding system for error protecting both insignificant and significant symbols of a digital message to be transmitted from a transmitter to a receiver of a digital system. Error protection for both insignificant and significant symbols is provided by coding at the transmitter both significant and insignificant symbols of message blocks forming the digital message. The symbol rate of the coded signal to be transmitted is reduced and unequal error protection is provided to the significant symbols by puncturing a selected number of insignificant symbols of each codeword of the coded signal. At the receiver, a correction determination is made for each received codeword as to whether the erasures and errors of the received codeword are correctable. The correction determination is a function of the number of errors, number of erasures, and the minimum distance of the code. Based on this correction determination, the received codeword is depunctured and decoded.

21 Claims, 6 Drawing Sheets

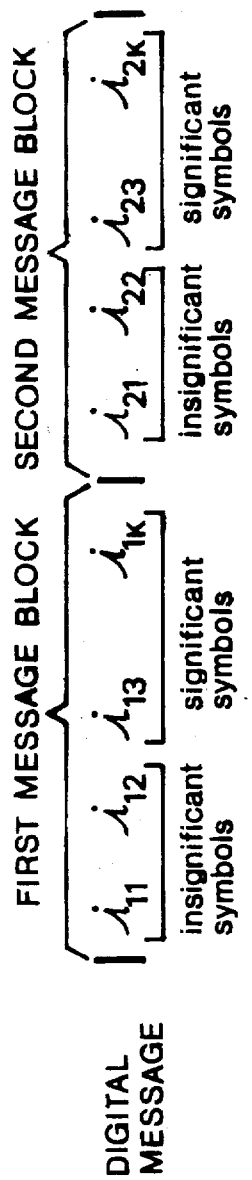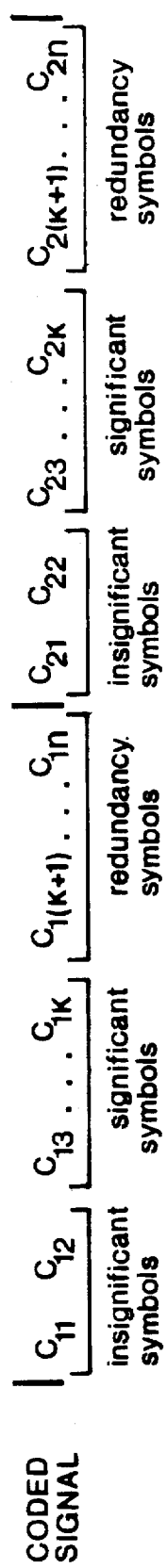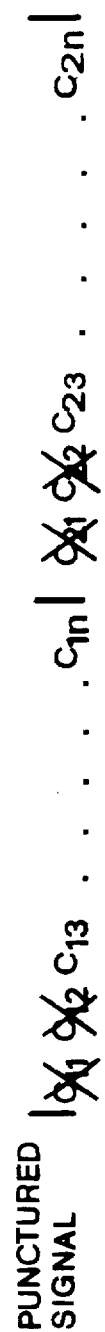

RECEIVED
PUNCTURED
SIGNAL
(CHANNEL OUTPUT
SIGNAL)

$| \quad O_{13} \quad \cdot \quad \cdot \quad O_{1n} | \quad \quad O_{23} \quad \cdot \quad \cdot \quad O_{2n} |$

Fig.4d

DEPUNCTURED
SIGNAL $|\hat{O}_{11} \quad \hat{O}_{12} \quad \hat{O}_{13} \quad \cdot \quad \cdot \quad \hat{O}_{1n} | \hat{O}_{21} \quad \hat{O}_{22} \quad \hat{O}_{23} \quad \cdot \quad \cdot \quad \hat{O}_{2n} |$

Fig.4e

ESTIMATED
MESSAGE $| e_{11} \quad e_{12} \quad e_{13} \quad \cdot \quad \cdot \quad e_{1n} | e_{21} \quad e_{22} \quad e_{23} \quad \cdot \quad \cdot \quad e_{2K} |$

Fig.4f

PUNCTURED CODING SYSTEM FOR PROVIDING UNEQUAL ERROR PROTECTION IN A DIGITAL COMMUNICATION SYSTEM

FIELD OF THE INVENTION

The present invention relates generally to a punctured coding system for a digital communication system, and more particularly, a punctured coding system for providing unequal error protection for selected symbols in a digital message.

BACKGROUND OF THE INVENTION

Digital communication systems convey a digital message by transmitting a symbol stream from a transmitter to a receiver over a transmission channel. Transmission channels often contain noise that tends to corrupt the transmitted symbol stream, resulting in transmission errors and the loss of part of the transmitted digital message. Corruption of the transmitted symbol stream is a particular problem for wireless transmission channels due to the high level of noise in wireless transmission channels.

To minimize the impact of noise on the digital message being transmitted, various different coding techniques, often referred to as forward error correction (FEC) techniques, can be used to code the digital message. Representative FEC techniques for coding a digital message include BCH codes, cyclic codes, Hamming codes, Reed-Solomon codes, and Golay codes. One reference discussing FEC techniques is Shu Lin and Daniel Costello, *Error Control Coding: Fundamentals & Applications*, Prentice Hall, which is incorporated by reference. When properly designed, coding the digital message with FEC techniques improves the quality of the digital message received at the receiver.

One problem with coding digital messages is that an increased number of symbols are used to represent the digital message, and accordingly, the symbol rate of the symbol stream being transmitted over the transmission channel must also increase. When the symbol rate increases, the amount of bandwidth required to transmit the symbol stream representing the digital message also increases. The requirement of increased bandwidth to transmit the digital message can be a problem because of the limited amount of bandwidth available and the high expense of using bandwidth. Accordingly, the benefits of coding digital messages is at least partially offset by the disadvantage of the need for increased bandwidth to transmit the coded message.

The problem of increasing the bandwidth requirement by coding has been addressed in the prior art by only coding selected significant symbols of the digital message to be transmitted. These partial coding systems take advantage of the fact that digital messages often include significant symbols and insignificant symbols. The significant symbols represent the more essential information of the digital message and the insignificant symbols represent relatively less essential information. Partial coding systems code the significant symbols and leave the insignificant symbols uncoded. Accordingly, partial coding schemes help protect the significant symbols from transmission errors and leave the insignificant symbols less protected. Partial coding schemes are used where increases in bandwidth necessitated by coding is only deemed worthwhile for the significant symbols. This results in unequal error protection for the digital message where the significant symbols are protected and the insignificant symbols are unprotected. Because the insignificant symbols are unprotected, any transmission errors affecting the insignificant symbols corrupt, at least to some degree, the quality of the received digital message.

SUMMARY OF THE INVENTION

The present invention is a coding system for error protecting both insignificant and significant symbols of a digital message to be transmitted from a transmitter to a receiver of a digital system. Error protection for both insignificant and significant symbols is provided by coding both significant and insignificant symbols of message blocks forming the digital message. The symbol rate of the coded signal to be transmitted is reduced and unequal error protection is provided to the significant symbols by puncturing a selected number of insignificant symbols of each codeword of the coded signal. At the receiver, a correction determination is made for each received codeword as to whether the erasures and errors of the received codeword are correctable. The correction determination is a function of the number of errors, number of erasures, and the minimum distance of the code. Based on this correction determination, the received codeword is depunctured and decoded.

A digital communication system according to the present invention includes a coding circuit, a puncturing circuit, a depuncturing circuit, and a decoding circuit. The coding circuit codes a digital message according to a predetermined code prior to transmission to produce codewords having significant message symbols, insignificant message symbols, and redundancy symbols. The redundancy symbols error protect both the significant and insignificant message symbols. The puncturing circuit punctures $\tau$ insignificant symbols of each codeword prior to transmission so as to produce erasures in the codewords. The punctured codewords are then transmitted from the transmitter to the receiver over the communication channel.

A depuncturing circuit in the receiver depunctures the received punctured codewords to produce depunctured codewords. The depuncturing circuit determines for each received punctured codeword if the punctured codeword is correctable. If the codeword is determined to be correctable, the punctured codeword is corrected and a corrected depunctured codeword is generated. If the punctured codeword is determined to be non-correctable, the punctured codeword is not corrected and a non-corrected depunctured codeword is generated.

The depunctured codewords are decoded by the decoding circuit to produce received message symbols. The received message blocks generated from the corrected depunctured codewords are equivalent to their corresponding transmitted message blocks, while the received message blocks generated from the non-corrected depunctured codewords include errors.

BRIEF DESCRIPTION OF THE DRAWINGS

FIGS. 4a–4f show an example digital message being coded and decoded according to the present invention.

DETAILED DESCRIPTION OF THE PREFERRED EMBODIMENTS

The present invention is a punctured coding system for providing error protection for a digital message to be transmitted over a communication channel. The present invention punctured coding system is designed to be implemented in a digital communication system where the transmitted digital message may be corrupted by noise in the communication channel. Such communication systems include radio communication systems such as land-based cellular systems and satellite-based cellular systems.

Figure 1:
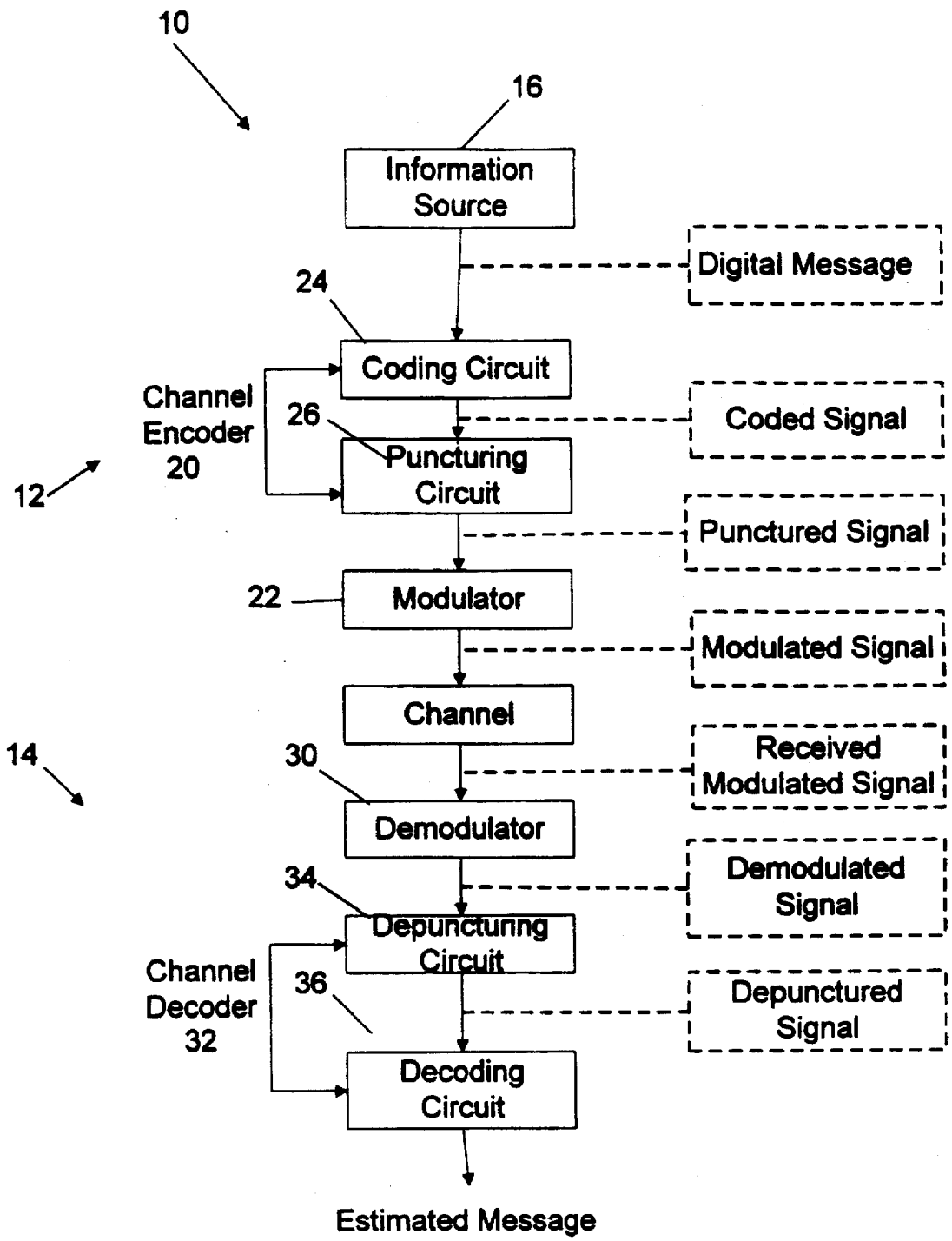
FIG. 1 is a block diagram of the digital communication system according to the present invention.

Referring to FIG. 1, a general schematic of a digital communication system 10 in which the punctured coding system of the present invention can be implemented is shown. The digital communication system 10 includes a transmitter 12 for coding and transmitting a digital message, and a receiver 14 for receiving and decoding the received digital message. The transmitter 12 and receiver 14 include communication components, described below, which are selected, arranged, and configured to implement the punctured coding system of the present invention.

Transmitter 12 includes an information source 16, channel encoder 20, and modulator 22. The information source 16 generates a digital message formed by a stream of message blocks containing significant and insignificant symbols. In one preferred embodiment, the information source 16 is a vocoder such as a VCELP (or CELP) vocoder. Such a vocoder generates a stream of message blocks having significant and insignificant symbols representing speech, and is used in the GSM standard used widely in Europe. The channel encoder 20 has a coding circuit 24 for coding the digital message to form a coded signal formed by codewords and a puncturing circuit 26 for puncturing the codewords to produce a punctured signal. The digital message is coded according to a selected code to provide error protection for both the significant and insignificant symbols of the digital message. Each codeword is punctured according to a selected puncture deleting pattern to produce a corresponding punctured codeword having erasures. Modulator 22 uses the punctured signal to produce a modulated signal which is transmitted over the communication channel.

The receiver 14 includes a demodulator 30 and channel decoder 32 for receiving and decoding the received modulated signal. The received modulated signal is a function of the noise in the channel and can be referred to as a channel output signal. The demodulator 32 demodulates the channel output signal to produce a demodulated signal. The demodulated signal corresponds to the transmitted punctured signal after it has been corrupted by the noise in the communication channel. The channel decoder 32 includes a depuncturing circuit 34 for depuncturing the demodulated signal and a decoding circuit 36 for decoding the depunctured signal. The depuncturing circuit 34 uses the deleting pattern of the puncturing circuit 26 to depuncture the demodulated signal, and the decoding circuit 36 uses the code of the coding circuit 24 to decode the depunctured signal. Channel encoder 20 and the channel decoder 32, as well as the channel encoder 20, can be implemented using conventional microprocessors currently used in radio communication systems.

Figure 2:
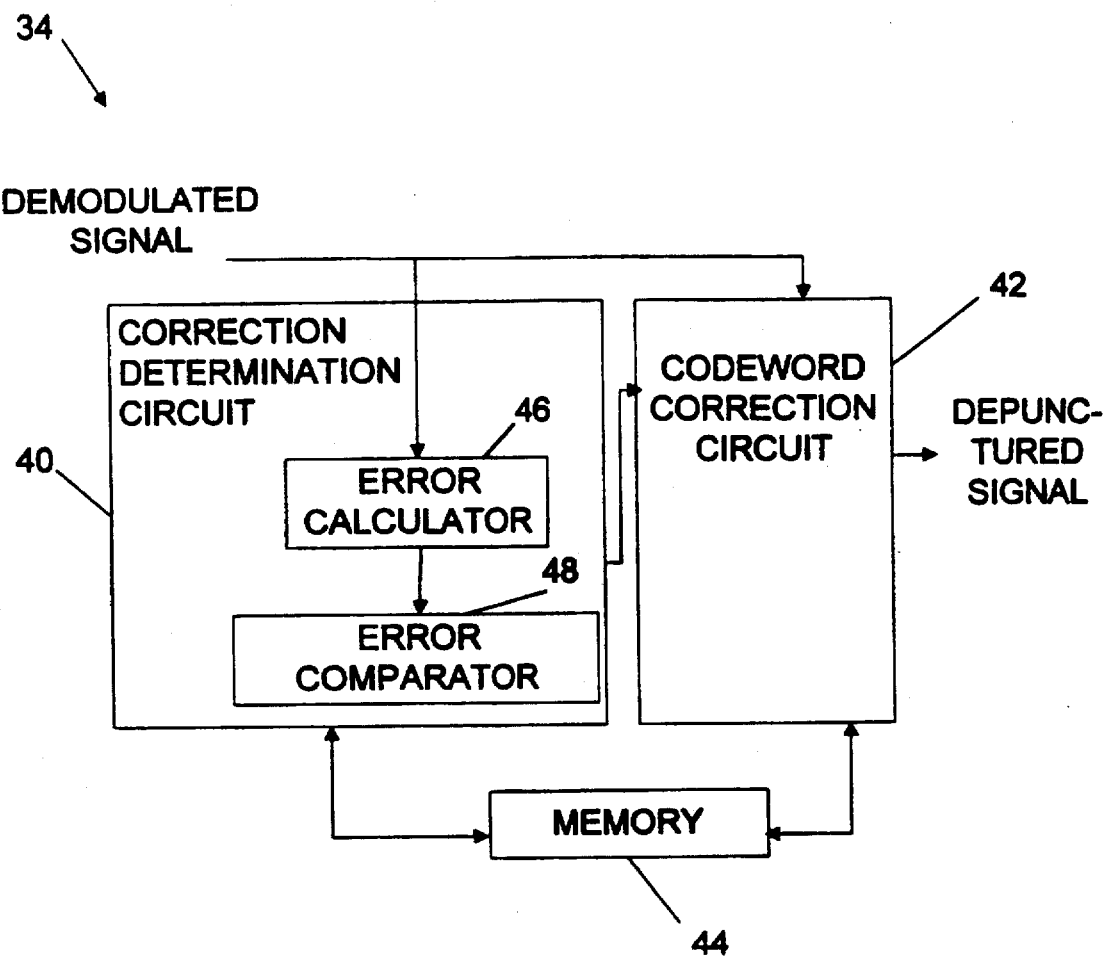
FIG. 2 is a block diagram of a depuncturing circuit according to the present invention.

A schematic of depuncturing circuit 34 is shown in FIG. 2. The depuncturing circuit 34 generally includes a correction determination circuit 40, a codeword correction circuit 42 and a memory 44. Correction determination circuit 40 includes an error calculator 46 and error comparator 48, and functions to determine whether each codeword is correctable. A correctable codeword is a codeword for which all error symbols in the codeword and erasures can be corrected.

To determine whether a codeword is correctable, the error calculator 46 determines the number of error symbols for each codeword. The number of error symbols is outputted to the error comparator 48 which compares the number of error symbols in the received codeword caused by the transmission to a predetermined maximum threshold. The predetermined maximum threshold is a function of the minimum distance of the code and number of erasures. The predetermined maximum threshold is stored in memory 44 and outputted to the correction determination circuit 40 for use in determining whether each codeword is correctable. If the number of error symbols is less than the predetermined maximum threshold for a given codeword, then the error comparator 48 outputs a correctable determination signal to the codeword correction circuit 42. If the number of error symbols is more than the predetermined maximum threshold for a given codeword, then the error comparator 48 outputs a noncorrectable determination signal to the codeword correction circuit 42.

The codeword correction circuit 42 corrects errors and erasures in a received codeword in response to a correctable determination signal, and outputs a corrected depunctured codeword. Errors and erasures are corrected in the codeword by using bounded distance decoding algorithms (such as the Berlekamp-Massey algorithm). A corrected depunctured codeword is a codeword where errors and erasures are corrected. In the preferred embodiment, all errors and erasures in the received codeword are corrected in response to the correctable determination signal. When a noncorrectable determination signal for a codeword is input into the codeword correction circuit 42, errors and erasures in the codeword cannot be corrected. In this case, the codeword correction circuit 42 fills the erasures with arbitrary or correlated symbols, and outputs a noncorrected depunctured codeword.

The corrected and noncorrected depunctured codewords form the depunctured signal which is output to decoding circuit 36 for decoding. The decoding circuit 36 decodes the depunctured signal and outputs an estimated message formed by corrected message blocks and noncorrected message blocks.

Figure 3A:
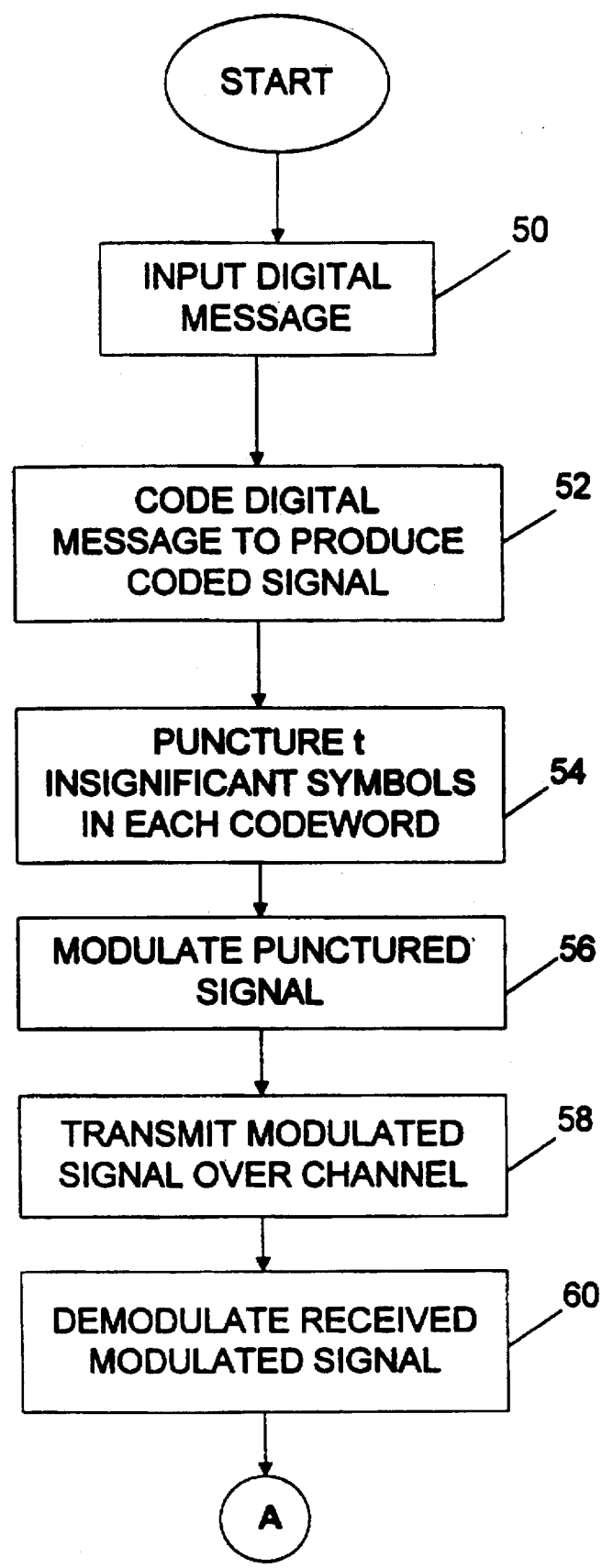
FIGS. 3a and 3b are a flow chart showing operational steps of the digital communication system according to the present invention.
Figure 3B:
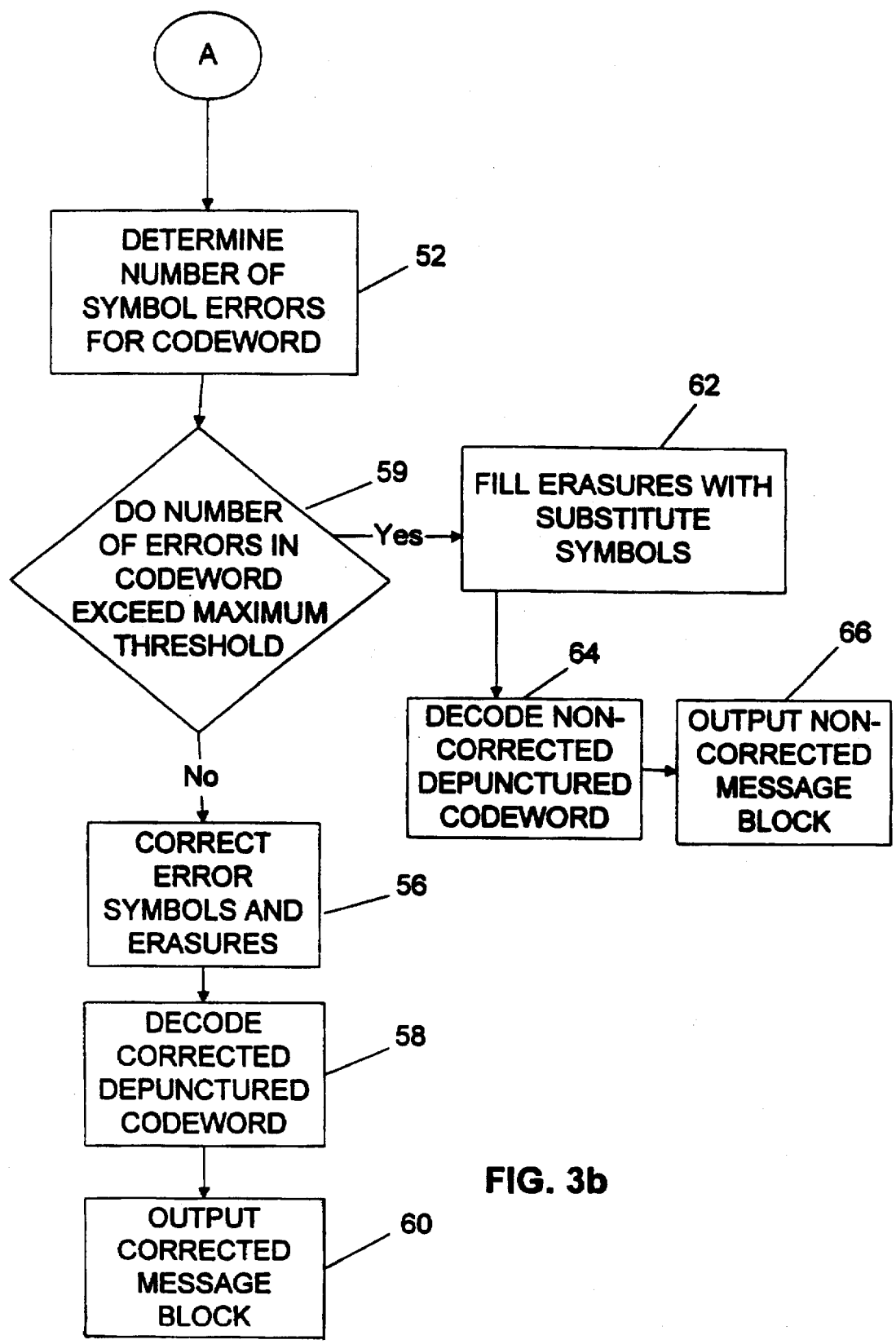

A flowchart describing the overall operation of digital communication system 10 and the unequal error protection provided by channel encoder 20 and channel decoder 32 is shown in FIGS. 3a and 3b. Referring to FIG. 3, a digital message is first outputted by information source 16 to channel encoder 20 (step 50). The digital message is a stream of message blocks with each message block including a plurality of message symbols. The message symbols of each message block are arranged in a known symbol pattern of significant symbols and insignificant symbols.

The coded signal is outputted to the coding circuit 24 and the digital message is coded to produce a coded signal formed by successive codewords (step 52). Each codeword corresponds to one of the message blocks. In the preferred embodiment, the coded signal is coded according to a systematic code (or any encoding scheme where message symbols can be placed in specified coordinates in a codeword). Systematically coding the digital message results in a message block of k symbols being represented by a codeword of n symbols, where n is great than k. Each codeword has the k message symbols of the corresponding message block and n-k redundancy symbols. The k message symbols are arranged in a known symbol pattern of significant symbols and insignificant symbols. The redundancy symbols provide error protection for both the significant and insignificant message symbols.

The coded signal is outputted to the puncturing circuit 26 and τ insignificant symbols of each codeword are punctured according to a deleting pattern to produce a punctured signal (step 54). The punctured signal is formed by codewords having τ erasures. The deleting pattern to puncture the codewords is selected to puncture τ insignificant symbols, where τ equals a selected number of the insignificant symbols. The number of τ insignificant symbols chosen to be punctured depends on factors such as the length of the codewords n, the desired bit rate of the code, and the anticipated amount of noise in the channel. The deleting pattern is selected based on the symbol pattern dictating which code symbols are insignificant symbols and which code symbols are significant symbols. The punctured symbol is then outputted to modulator 22 which generates a modulated signal corresponding to the punctured signal (step 56). The modulated signal is then transmitted over a communication channel (step 58).

Demodulator 30 of receiver 14 receives a channel output signal which is the modulated signal after it has been modified by the channel (step 60). The demodulator 30 demodulates the channel output signal to produce a demodulated signal or received punctured signal. The received punctured signal is formed by received punctured codewords. Because of noise in the channel, errors tend to be introduced into the symbols of the received punctured codewords. Symbols in error in the received punctured codewords are referred to as error symbols.

The received punctured signal is outputted to depuncturing circuit 34 where each codeword of the received punctured signal is successively processed codeword by codeword as follows. First, a received codeword is processed by error calculator 46 of correction determination circuit 40 to determine the number of error symbols $e_s$ in the received codeword (step 62). Methods for determining the number of error symbols $e_s$ in a received codeword are known in the prior art and can be determined in the preferred embodiment by bounded distance decoding. The number of determined error symbols $e_s$ is then outputted to error comparator 48 which compares the number of error symbols $e_s$ to a stored maximum error threshold $e_t$ (step 54). When using bounded distance decoding, the error calculator 46 can calculate the actual number of error symbols up to the maximum error threshold $e_t$. For received codewords having a number of error symbols greater than the maximum error threshold et, error calculator 46 determines that the number of error symbols is some number greater than the maximum error threshold $e_t$. Accordingly, error calculator 46 can determine that the number of error symbols $e_s$ equals any of the following: $1, 2, \ldots, e_t > e_t$.

In the preferred embodiment, the stored maximum error threshold $e_t$ is stored in memory 44 and is derived according to a maximum error threshold equation:

$$e_t = \left\lfloor \frac{d_{min} - 1 - \tau}{2} \right\rfloor,$$

where $d_{min}$ is the minimum distance of the code, τ is the number of erasures, and $\lfloor \ \rfloor$ designates a floor function such that $e_t$ equals the largest integer smaller than $$\frac{d_{min} - 1 - \tau}{2}.$$

The maximum error threshold $e_t$ is the maximum number of errors at which the τ erasures and the $e_s$ error symbols can be corrected. In the preferred embodiment, a receiver codeword is correctable if each of the $e_s$ error symbols in the codeword can be corrected and the τ erasures can be corrected.

If the number of error symbols $e_d$ is less than or equal to the maximum error threshold $e_t$, then error symbols and erasures are corrected to produce a corrected depunctured codeword (step 56). In the preferred embodiment, all of the $e_s$ error symbols and τ erasures are corrected by processing the codeword using bounded distance decoding algorithms. In alternative embodiments, substantially all of the $e_s$ error symbols are τ erasures are corrected by processing the codeword using bounded distance decoding algorithms. The corrected depunctured codeword is outputted to the decoding circuit 36 and the corrected depunctured codeword is decoded by decoding circuit 36 (step 60). The decoding circuit 36 outputs an error corrected message block formed by message symbols that are equivalent to the message symbols of the corresponding message block transmitted from transmitter 12.

If the number of error symbols $e_s$ is greater then the maximum error threshold $e_t$, then the codeword is uncorrectable. When the codeword is uncorrectable, substitute symbols are generated and used to fill in the punctured symbol (step 58) and the symbol errors are not corrected. The substitute symbols can be arbitrary symbols or can be generated through correlation techniques such as interpolation of message symbols. The non-corrected depunctured codeword is then output to decoding circuit 36 which decodes the depunctured codeword (step 64). In the preferred embodiments, the non-corrected depunctured codeword is decoded by outputting the symbols of the depunctured codeword corresponding to the coordinates of the message symbols in the transmitted message block. For instance, the first k symbols of the depunctured codeword (with substitute symbols) is outputted when systematic coding is used. Because the codeword was uncorrectable, the decoding circuit 36 outputs a non-corrected message block (step 66). The non-corrected message block includes message symbols that are not equivalent to the message symbols of the corresponding transmitted message block.

Referring to FIG. 4 a schematic representation of an example digital message being transmitted from transmitter 12 and received by receiver 14 is shown. The digital message is processed in transmitter 12 and receiver 14 on a block-by-block basis. The digital message is formed by a plurality of successive message blocks of k symbols. A first message block having symbols $i_{11}$ to $i_{1k}$ and a second message block having symbols $i_{21}$ to $i_{2k}$ is shown in FIG. 4a. The first two symbols of each message block are designated as insignificant symbols and the remaining symbols are designated as significant symbols. As shown in FIG. 4a, in the first message block symbols $i_{11}$ to $i_{12}$ are insignificant and symbols $i_{13}$ to $i_{1k}$ are significant. Likewise, in the second message block symbols $i_{21}$ and $i_{22}$ are insignificant symbols and symbols $i_{23}$ to $i_{2k}$ are significant.

The first and second message blocks are coded by coding circuit 24 to produce a first codeword corresponding to the first message block and a second codeword corresponding to the second message block. Each codeword is formed by message symbols (i.e., insignificant and significant symbols) and redundancy symbols. As shown in FIG. 4b, in the first codeword symbol $c_{11}$ and $c_{12}$ are insignificant symbols, $c_{13}$ to $c_{1k}$ are significant symbols and $c_{1(k+1)}$ to $c_{2k}$ are redundancy symbols. Likewise, in the second codeword symbols $c_{21}$ and $c_{22}$ are insignificant symbols, $c_{23}$ to $c_{2k}$ are significant symbols, and $c_{2(k+1)}$ to $c_{2n}$ are redundancy symbols.

The first and second codewords are successively punctured by puncturing circuit 26 such that insignificant symbols $c_{11}$ and $c_{12}$ of the first codeword are punctured and insignificant symbols $c_{21}$ and $c_{22}$ of the second codeword are punctured. The punctured symbols of the codeword are shown crossed out in FIG. 4c. The punctured signal is modulated and is transmitted to receiver 14.

Receiver 14 includes a demodulator 30 which demodulates the received modulated signal and outputs a received punctured signal or channel output signal. As shown in FIG. 4d, the received punctured signal includes a first received codeword having symbols $o_{13}$ to $o_{1n}$ and a second received codeword having symbols $o_{23}$ to $o_{2n}$. If no errors have been introduced during transmission, then symbols $o_{13}$ to $o_{1n}$ of the first received codeword equals symbols $c_{13}$ to $c_{1n}$ of the transmitted first punctured Codeword, and symbols $o_{23}$ to $o_{2n}$ of the second received codeword equals symbols $c_{23}$ to $c_{2n}$ of the transmitted second punctured codeword.

As shown in FIG. 4e, the received punctured signal is depunctured by depuncturing circuit 34 to produce a first depunctured codeword $\delta_{rn}$ to $\delta_{1n}$ and a second depunctured codeword $\delta_{21}$ to $\delta_{2n}$. Assuming that the first received codeword was correctable, then errors and erasures are corrected in the received codeword and symbols $\delta_{11}$ to $\delta_{1n}$ of the first depunctured codeword equals symbols $c_{11}$ to $c_{1n}$ of the pre-transmission coded signal. Assuming that the second received codeword was not correctable, then the errors and erasures are not correctable in the received second codeword and symbols $\delta_{21}$ to $\delta_{2n}$ of the second depunctured codeword will contain errors. Accordingly, the symbols of $\delta_{21}$ to $\delta_{2n}$ of the second depunctured codeword does not equal symbol $c_{21}$ to $c_{2n}$ of the corresponding pre-transmission codeword.

The first and second depunctured codewords are decoded by decoding circuit 36, and a first estimated message block and a second estimated message block is outputted from decoding circuit 36. As shown in FIG. 4f, the first estimated message block includes symbols $e_{11}$ to $e_{1k}$ and the second estimated message block includes symbols $e_{21}$ to $e_{2k}$. The quality of an estimated message block depends on whether the corresponding received codeword was correctable. For example, if the first message block was correctable, symbols $e_{11}$ to $e_{1k}$ equal symbols $i_{11}$ to $i_{1k}$ Of the first message block, and the first estimated message block is not impaired. As a second example, assume that the second received codeword was not correctable. If the second received codeword was not correctable, the symbols $e_{21}$ to $e_{2k}$ do not equal the symbols $i_{21}$ to $i_{2k}$ of the second message block. Accordingly, the second estimated message block will include some impairment to the quality of the second estimated message block. Although the second estimated message block will include a certain number of errors, the significant symbols are less likely to be in error compared to the insignificant symbols because only insignificant symbols are punctured.

In summary, the coding system of the present invention codes a digital message to provide error protection for both insignificant and significant symbols of a digital message. Unequal error protection is provided to the significant symbols by puncturing only $\tau$ insignificant symbols. The punctured signal is transmitted to a receiver where the received signal is processed to determine if the erasures and introduced errors are correctable. A corrected message block is generated if the received signal is correctable, and a non-corrected message block is generated if the received signal is not correctable.

Specific details of the block elements of the digital communication system 10 described above can be located in many references previously published and a detailed discussion of such is not deemed necessary. Different embodiments and adaptations besides those shown herein and described as well as many variations, modifications and equivalent arrangements will now be apparent or will be reasonably suggested by the foregoing specification and drawings, without departing from the substance or scope of the invention. While the present invention has been described herein in detail in relation to its preferred embodiments, it is to be understood that this disclosure is only illustrative and exemplary of the present invention and is merely for purposes of providing a full and enabling disclosure of the invention. Accordingly, it is intended that the invention be limited only by the spirit and scope of the claims appended hereto.

What is claimed is:

1. A coding method for error protecting a digital message to be transmitted from a transmitter to a receiver over a channel, comprising:

a) coding the digital message according to a predetermined code prior to transmission to produce codewords having significant message symbols, insignificant message symbols, and redundancy symbols, wherein the redundancy symbols error protect both the significant and insignificant message symbols;

b) puncturing $\tau$ insignificant symbols of each codeword prior to transmission so as to produce erasures in the codewords;

c) depuncturing the punctured codewords after transmission to produce depunctured codewords, the step of depuncturing received punctured codewords including:

1) determining for each received punctured codeword if the punctured codeword is correctable, and 2) correcting the punctured codewords determined to be correctable so as to produce corrected depunctured codewords;

d) decoding the depunctured codewords.

2. The coding method of claim 1, wherein when a received punctured codeword is determined to be correctable the erasures in the received punctured codeword are filled with the corresponding $\tau$ punctured symbols and error symbols are corrected such that the message symbols of the corrected depunctured codeword is equivalent to the message symbols of the corresponding transmitted codeword, and when a received punctured codeword is determined not to be correctable the erasures in the received punctured codeword are filled with substitute symbols and errors are not corrected such that the message symbols of the non-corrected depunctured codeword is not equivalent to the message symbols of the corresponding transmitted codeword.

3. The coding method of claim 1, wherein the predetermined code is a systematic code.

4. The coding method of claim 1, wherein the step of determining if the punctured codeword is correctable includes determining the number of error symbols $e_s$ in the codeword.

5. The coding method of claim 4, wherein the step of determining if the punctured codeword is correctable is a function of the number of error symbols $e_s$, the number of $\tau$ erasures, and the minimum distance $d_{min}$ of the predetermined code.

6. The coding method of claim 5, wherein the step of determining if the punctured codeword is correctable includes comparing the number of error symbols e to a maximum threshold, wherein the maximum threshold is determined as a function of a maximum threshold equation:

$$\left\lfloor \frac{d_{min} - 1 - \tau}{2} \right\rfloor,$$

where $d_{min}$ is the minimum distance of the predetermined code and $\tau$ is the number of erasures in the codeword.

7. The coding method of claim 6, wherein the codeword is correctable if $$e_s \leq \left\lfloor \frac{d_{min} - 1 - \tau}{2} \right\rfloor.$$

8. A coding system for error protecting a digital message to be transmitted from a transmitter to a receiver over a channel, comprising:
   a) a coding circuit for coding the digital message according to a predetermined code prior to transmission to produce codewords having significant message symbols, insignificant message symbols, and redundancy symbols, wherein the redundancy symbols error protect both the significant and insignificant message symbols;
   b) a puncturing circuit for puncturing $\tau$ insignificant symbols of each codeword prior to transmission so as to produce erasures in the codewords;
   c) a depuncturing circuit for depuncturing the punctured codewords after transmission to produce depunctured codewords, the depuncturing circuit including:
      1) correction determination means for determining for each received punctured codeword if the punctured codeword is correctable, and
      2) correction means for correcting the punctured codewords determined to be correctable so as to produce corrected depunctured codewords; and
   d) a decoding circuit for decoding the depunctured codewords.

9. The coding system of claim 8, wherein when a received punctured codeword is determined to be correctable the erasures in the received punctured codeword are filled with the $\tau$ punctured symbols and error symbols are corrected such that the message symbols of the corrected depunctured codeword is equivalent to the message symbols of the corresponding transmitted codeword, and when a received punctured codeword is determined not to be correctable the erasures in the received punctured codeword are filled with substitute symbols and errors are not corrected such that the message symbols of the non-corrected depunctured codeword is not equivalent to the message symbols of the corresponding transmitted codeword.

10. The coding system of claim 8, wherein the predetermined code is a systematic code.

11. The coding system of claim 8, wherein the correction determination means includes means for determining the number of error symbols $e_s$ in the codeword.

12. The coding system of claim 11, wherein the correction determination means for determining if the punctured codeword is correctable is a function of the number of error symbols $e_s$, the number of $\tau$ erasures, and the minimum distance $d_{min}$ of the predetermined code.

13. The coding system of claim 12, wherein the correction determination means for determining if the punctured codeword is correctable includes comparing the number of error symbols $e_s$ to a maximum threshold, wherein the maximum threshold is determined as a function of a maximum threshold equation:

$$\left\lfloor \frac{d_{min} - 1 - \tau}{2} \right\rfloor,$$

where $d_{min}$ is the minimum distance of the predetermined code and $\tau$ is the number of erasures in the codeword.

14. The coding system of claim 13, wherein the codeword is correctable if $$e_s \leq \left\lfloor \frac{d_{min} - 1 - \tau}{2} \right\rfloor.$$

15. A digital communication method comprising:
   a) receiving a digital message including message blocks of k message symbols where the message blocks have significant message symbols and insignificant message symbols;
   b) coding the digital message to produce code words corresponding to the message blocks, the code words having n code symbols, where n>k and each code word includes the message symbols of the corresponding message block and redundancy symbols;
   c) puncturing $\tau$ insignificant symbols of each code word to produce a punctured signal including punctured code words with each punctured codeword having $\tau$ erasures;
   d) transmitting the punctured signal over a channel;
   e) receiving the punctured signal transmitted over the channel, the received punctured signal including received punctured code words;
   f) determining for each received punctured code word if the code word is correctable;
   g) correcting the code words determined to be correctable.

16. The coding method of claim 15, wherein when a received punctured codeword is determined to be correctable the erasures in the received punctured codeword are filled with the $\tau$ punctured symbols and error symbols are corrected such that the message symbols of the corrected depunctured codeword is equivalent to the message symbols of the corresponding transmitted codeword, and when a received punctured codeword is determined not to be correctable the erasures in the received punctured codeword are filled with substitute symbols and errors are not corrected such that the message symbols of the non-corrected depunctured codeword is not equivalent to the message symbols of the corresponding transmitted codeword.

17. The coding method of claim 15, wherein the predetermined code is a systematic code.

18. The coding method of claim 15, wherein the step of determining if the punctured codeword is correctable includes determining the number of error symbols $e_s$ in the codeword.

19. The coding method of claim 18, wherein the step of determining if the punctured codeword is correctable is a function of the number of error symbols $e_s$, the number of $\tau$ erasures, and the minimum distance $d_{min}$ of the predetermined code.

20. The coding method of claim 19, wherein the step of determining if the punctured codeword is correctable includes comparing the number of error symbols $e_s$ to a maximum threshold, wherein the maximum threshold is determined as a function of a maximum threshold equation:

$$\left\lfloor \frac{d_{min} - 1 - \tau}{2} \right\rfloor,$$

where $d_{min}$ is the minimum distance of the predetermined code and $\tau$ is the number of erasures in the codeword.

21. The coding method of claim 18, wherein the codeword is correctable if $$e_s \leq \left\lfloor \frac{d_{min} - 1 - \tau}{2} \right\rfloor.$$

* * * * *